United States Patent
Karri et al.

(10) Patent No.: US 12,395,580 B2
(45) Date of Patent: Aug. 19, 2025

(54) OLED DISPLAY MODULE STRUCTURE FOR MITIGATING DARK SPOT VISIBILITY IN BACK COVER OPEN REGIONS

(71) Applicant: GOOGLE LLC, Mountain View, CA (US)

(72) Inventors: Jyothi Karri, San Jose, CA (US); Sangmoo Choi, Palo Alto, CA (US)

(73) Assignee: Google LLC, Mountain View, CA (US)

(*) Notice: Subject to any disclaimer, the term of this patent is extended or adjusted under 35 U.S.C. 154(b) by 479 days.

(21) Appl. No.: 17/758,273

(22) PCT Filed: Aug. 28, 2020

(86) PCT No.: PCT/US2020/070481
§ 371 (c)(1),
(2) Date: Jun. 30, 2022

(87) PCT Pub. No.: WO2022/046157
PCT Pub. Date: Mar. 3, 2022

(65) Prior Publication Data
US 2023/0006169 A1    Jan. 5, 2023

(51) Int. Cl.
*H04M 1/02* (2006.01)
*H10K 50/86* (2023.01)
(Continued)

(52) U.S. Cl.
CPC .......... *H04M 1/0266* (2013.01); *H10K 50/86* (2023.02); *H10K 50/87* (2023.02);
(Continued)

(58) Field of Classification Search
CPC ......... H10K 50/805–828; H10K 39/34; H10K 59/60; H10K 59/65; H10K 59/126;
(Continued)

(56) References Cited

U.S. PATENT DOCUMENTS

| | | |
|---|---|---|
| 9,557,589 B2 | 1/2017 | Park et al. |
| 10,019,940 B2 | 7/2018 | Rappoport et al. |
| (Continued) | | |

FOREIGN PATENT DOCUMENTS

| | | |
|---|---|---|
| CN | 1334477 | 2/2002 |
| CN | 102272814 | 12/2011 |
| (Continued) | | |

OTHER PUBLICATIONS

Office Action in Chinese Appln. No. 202080103420.6, mailed on Aug. 1, 2024, 21 pages (with English translation).
(Continued)

*Primary Examiner* — Steven B Gauthier
*Assistant Examiner* — Adam D Weiland
(74) *Attorney, Agent, or Firm* — Fish & Richardson P.C.

(57) ABSTRACT

A mobile computing device includes an emissive display panel configured to emit light from a front surface of the display panel, with the display panel having a plurality of transparent layers and an opaque back cover layer. The mobile computing device also includes a light sensor located behind the opaque back cover layer, and the opaque back cover layer includes an opening through which light from outside the display that is transmitted through the transparent layers of the display can pass to reach the sensor. An air gap separates the light sensor from the transparent layers of the display panel. The plurality of transparent layers includes a reflection attenuating layer on a back side of the display panel configured to attenuate the reflection of light from an interface between a transparent layer of the display panel and the air gap.

21 Claims, 10 Drawing Sheets

(51) Int. Cl.
  *H10K 50/87*  (2023.01)
  *H10K 59/80*  (2023.01)
  *H10K 85/10*  (2023.01)
(52) U.S. Cl.
  CPC ....... *H10K 59/8791* (2023.02); *H10K 85/111* (2023.02); *H10K 59/8794* (2023.02)
(58) Field of Classification Search
  CPC .... H10D 64/60–693; H10D 89/10–105; G02F 1/133314; G02F 1/133528; H01L 51/5281; H01L 51/5284; H01L 27/3227; H01L 27/3234; H01L 27/3272; H01L 27/3273; H10L 27/3227; H10L 27/3234; H10L 27/3272; H04M 1/0266; H04M 1/026
  See application file for complete search history.

(56) References Cited

U.S. PATENT DOCUMENTS

| | | | |
|---|---|---|---|
| 10,135,034 | B1 | 11/2018 | Bita et al. |
| 10,381,419 | B2 | 8/2019 | Lee |
| 2009/0153451 | A1 | 6/2009 | Takama et al. |
| 2010/0124667 | A1* | 5/2010 | Liu ..................... G02B 5/3083 428/480 |
| 2015/0122978 | A1* | 5/2015 | deJong ................. G01J 1/0429 250/225 |
| 2018/0337219 | A1 | 11/2018 | Rhee et al. |
| 2019/0079236 | A1* | 3/2019 | Hung ................... H10K 50/841 |
| 2019/0197281 | A1 | 6/2019 | Choi et al. |

FOREIGN PATENT DOCUMENTS

| | | | |
|---|---|---|---|
| CN | 103426901 | | 12/2013 |
| CN | 108027530 | | 5/2018 |
| WO | WO-2021036285 A1 * | 3/2021 | ........... H01L 27/156 |

OTHER PUBLICATIONS

International Search Report and Written Opinion for PCT Application No. PCT/US2020/070481, mailed on May 21, 2021, 11 pages.
International Preliminary Report on Patentability in International Appln. No. PCT/US2020/070481, mailed on Mar. 9, 2023, 8 pages.
Notice of Allowance in Chinese Appln. No. 202080103420.6, mailed on Jan. 27, 2025, 7 pages (with English translation).

\* cited by examiner

OLED DISPLAY MODULE STRUCTURE FOR MITIGATING DARK SPOT VISIBILITY IN BACK COVER OPEN REGIONS

CROSS REFERENCE TO RELATED APPLICATION

This application is a 35 U.S.C. § 371 National Stage Entry from PCT/US2020/070481, filed Aug. 28, 2020, the disclosure of which is hereby incorporated by reference in its entirety.

FIELD OF THE DISCLOSURE

The present disclosure relates to flat panel displays and more specifically to displays that include a through-the-display optical components (e.g., optical sensors/emitters).

BACKGROUND

Expanding a display to cover more area of a mobile device (e.g., mobile phone, tablet, etc.) may be desirable from, at least, a user experience standpoint. However, electro-optical devices positioned on a side of the mobile device that also includes the display (e.g., a front-facing camera, a light sensor, a proximity sensor, etc.) may compete for real estate on the side of the device that includes the display. Thus, a sensor on display side of the device may be located under the display, such that light passes through the display to reach the sensor. However, the presence of the sensor under the display may cause undesirable distortions to the appearance of the display.

SUMMARY

In a first general aspect, a mobile computing device includes an emissive display panel configured to emit light from a front surface of the display panel, with the display panel having a plurality of transparent layers and an opaque back cover layer. The mobile computing device also includes a light sensor located behind the opaque back cover layer, and the opaque back cover layer includes an opening through which light from outside the display that is transmitted through the transparent layers of the display can pass to reach the sensor. An air gap separates the light sensor from the transparent layers of the display panel. The plurality of transparent layers includes a reflection attenuating layer on a back side of the display panel configured to attenuate the reflection of light from an interface between a transparent layer of the display panel and the air gap.

Implementations can include one or more of the following features, alone, or in any combination with each other.

In an example, the display panel can include an active matrix organic light emitting diode (AMOLED) display.

In another example, the opaque back cover layer can include a metal layer configured to spread heat through the metal layer.

In another example, the reflection attenuating layer can include a first quarter wave plate, a linear polarizer, and a second quarter wave plate, wherein the linear polarizer is located between the first and second quarter wave plates.

In another example, the first quarter wave plate, the linear polarizer, and the second quarter wave plate can be located within the opening of the opaque back cover layer.

In another example, the first quarter wave plate, the linear polarizer, and the second quarter wave plate can be located above the opaque back cover layer, between the back cover layer and the front surface of the display panel.

In another example, the linear polarizer, and the second quarter wave plate can be located within the opening of the opaque back cover layer, and the first quarter wave plate can be located above the opaque back cover layer, between the back cover layer and the front surface of the display panel.

In another example, the first quarter wave plate can include a PET film layer.

In another example, the first quarter wave plate can include a combination of a PET film layer and a birefringent, non-PET, film layer.

In another example, one or more of the first quarter wave plate, the linear polarizer, or the second quarter wave plate can include a partially-transmissive, partially-opaque layer.

In another example, the reflection attenuating layer can include a partially-transmissive, partially-opaque layer that attenuates an intensity of light that passes through the layer.

In another example, the partially-transmissive, partially-opaque layer can be located within the opening of the opaque back cover layer.

In another example, the partially-transmissive, partially-opaque layer can be located above the opaque back cover layer, between the back cover layer and the front surface of the display panel.

In another example, the display panel can include a polarization layer that receives randomly-polarized light from outside the display panel and circularly polarizes the light as a result of the light propagating through the polarization layer.

In another example, the display panel can include OLED emitters and semiconductor circuit elements configured to control a luminance of light emitted from the OLED emitters, where the semiconductor circuit elements are shielded from direct light received from outside the display panel by at least some opaque structures in the display panel.

BRIEF DESCRIPTION OF THE DRAWINGS

The components in the drawings are not necessarily drawn to scale and may not be in scale relative to each other. Like reference numerals designate corresponding parts throughout the several views.

DETAILED DESCRIPTION

Figure 1A:
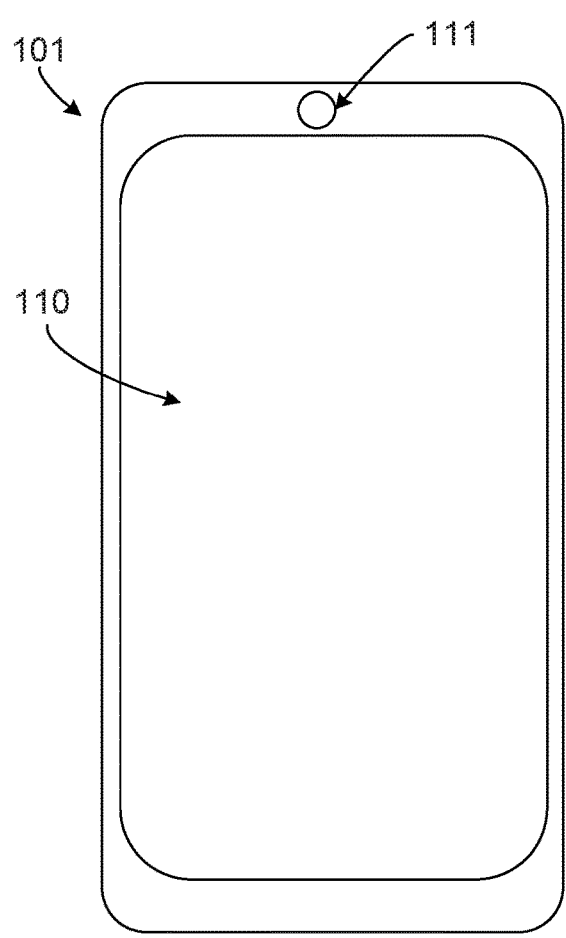
FIG. 1A depicts a top (front) surface of a mobile computing device including a display and an optical device that occupy different portions of the front surface.

The present disclosure describes a flat panel display (i.e., display) that can be used with a computing device (e.g., mobile phone, tablet, etc.). The front surface of a mobile device includes a display typically operating as a graphic user interface (GUI) and one or more optical devices operating as sensors/emitters in areas below the display and facing the front surface. The one or more optical devices can be configured for a variety of functions, including (but not limited to) sensing lighting conditions (e.g. an ambient light sensor), sensing proximity of objects near the display (e.g., electromagnetic sensor), capturing images (e.g., a fingerprint sensor).

A proximity sensor may include a transmitter and a receiver of electromagnetic radiation, which are used to determine proximity of the display to an object that reflects electromagnetic radiation transmitted by the transmitter, which radiation is then reflected by the object and received by the receiver. For example, when a percentage of the transmitted radiation intensity received at the receiver, after being reflected by an object, exceeds a threshold value, a signal from the proximity sensor may determine that the display is closer to the object than a threshold distance.

A fingerprint sensor also may include a transmitter and a receiver of electromagnetic radiation, which are used to image a fingerprint on a finger pressed to the display. For example, radiation can be transmitted from a transmitter of the fingerprint sensor, reflected off the finger, and then detected by the receiver. A fingerprint pattern can be determined based on the reflected light received at the receiver and may be compared to a stored data associated with a fingerprint.

An ambient light sensor may include a receiver of light and may determine an amount of ambient light received by the sensor.

Light sensors are used in many mobile devices. Recent advances in emissive display technology (e.g., active matrix organic light emitting diode (AMOLED)) facilitate extending the emissive (i.e., active) area of the display towards (e.g., to) the edges of the mobile device. By extending the active area of the display towards the edges of the mobile device, a user may experience the benefits of a larger display without the drawbacks of a larger device. However, this may leave insufficient space for light sensors or other optical devices outside the area of the emissive display on the front side of the mobile device.

The emissive display disclosed herein is configured to share the front surface of a mobile device with one or more sensors so that the active area of the display can be extended to the edges, without the need for leaving a gap in the display, or space around the display, for the light sensor(s). Accordingly, one or more portions of the disclosed display covering the light sensors can be configured so that the light sensor(s), positioned behind the display, can transmit and receive electromagnetic radiation through the display. Generally, an air gap separates the back side of the display panel from the light sensor(s).

Ideally, when a light sensor is located under the display panel light would pass unimpeded through the display panel to the sensor. However, in reality, light is scattered, absorbed, and reflected by elements within the display panel. Some the reflected and/or scattered light may interfere with the operation of the pixel circuits in the display panel, causing unintended operation of at least some of the pixel circuits. In particular, light (e.g., ambient light that passes through the display) can reflect off an interface between a back side of the display panel and an air gap between the panel and a light sensor and then strike semiconductor circuits that control the pixel luminance of OLEDs above the air gap. This reflected light can interfere with the intended luminance of the OLEDs, such that the OLEDs may have a different intensity and/or color than they are programmed to produce.

To mitigate this effect, structures are disclosed herein that reduce the amount of light reflected from the interface between a back side of the display panel and an air gap between the panel and a light sensor. For example, an antireflection polarizer or an attenuator can be placed at the interface to reduce reflections.

Traditionally, the display and the optical devices located on a surface of the device that includes the display have occupied separate areas of the front surface. For example, FIG. 1A depicts a mobile device 101 having a display 110 and a light sensor (e.g., ambient light sensor, proximity sensor, etc.) 111 that occupy different portions of the front surface.

Figure 1B:
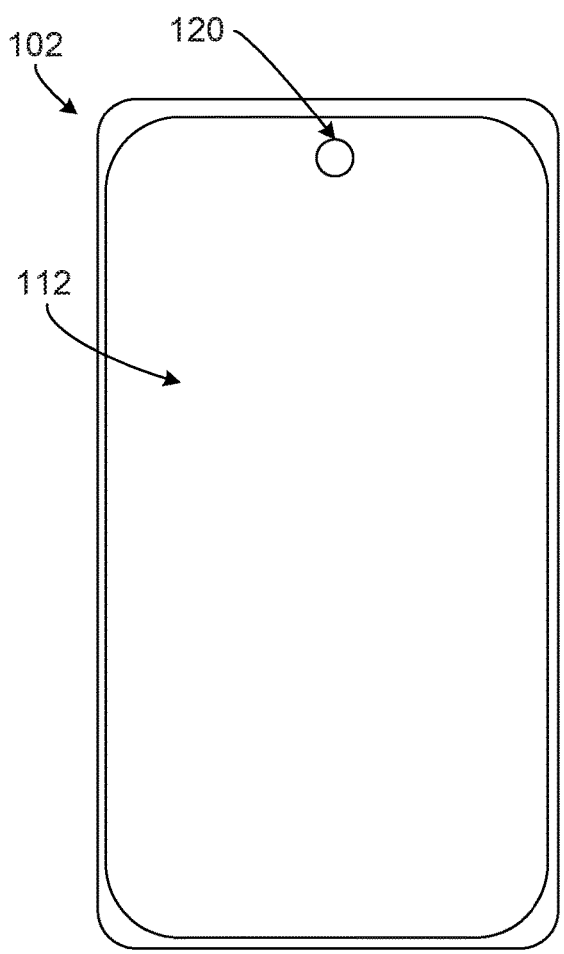
FIG. 1B depicts a top (front) surface of a mobile computing device including a display with a light sensor positioned behind an area of the display according to a possible implementation of the disclosure.

FIG. 1B illustrates a mobile device 102 with a display 112 that extends towards the edges of the device and that occupies a larger portion of the surface of the device 102 than does the display 110 of device 101. Unlike mobile devices in which the display is excluded from an area reserved for optical devices, the light-emitting (i.e., active) area of the display 112 extends over substantially the entire front surface. Accordingly, nearly the entire front surface of the mobile device 102 may be used to present color, black-and-white, or gray-scale images, graphics, and/or characters. In some implementations, the display 112 can include one or more areas 120 behind which (i.e., below which) a light sensor or emitter may be disposed.

The size, shape, and/or position of the area 120 may be implemented variously. For example, the area 120 shown in FIG. 1B has a rounded (e.g., circular) shape and is positioned apart from edges of the display 112, but this need not be the case. For example, the area 120 can have rectangular in shape and can be positioned along an edge of the display 112.

Figure 2A:
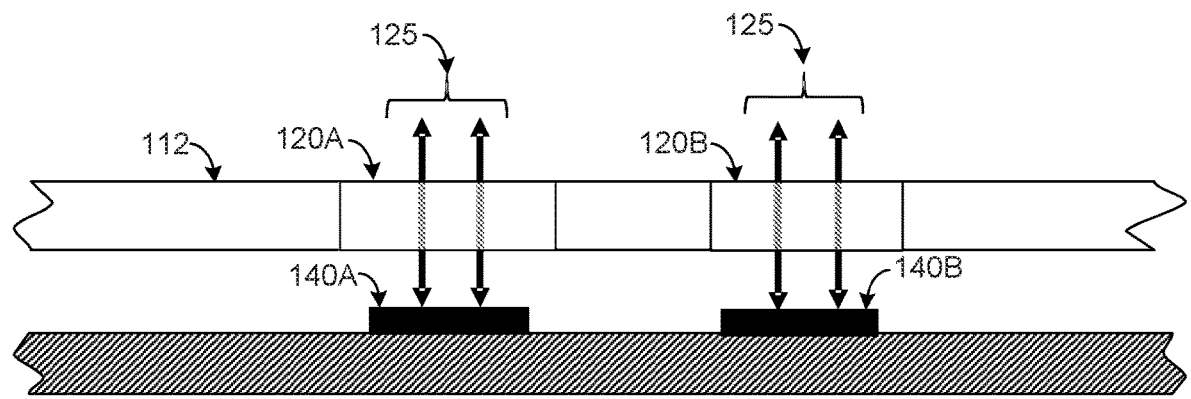
FIG. 2A depicts a side, cross-sectional view of a mobile device including a plurality of optical devices, each positioned behind a respective through-transmissive area of an emissive (e.g. OLED, micro-OLED or micro LED) display according to a possible implementation of the disclosure.
Figure 2B:
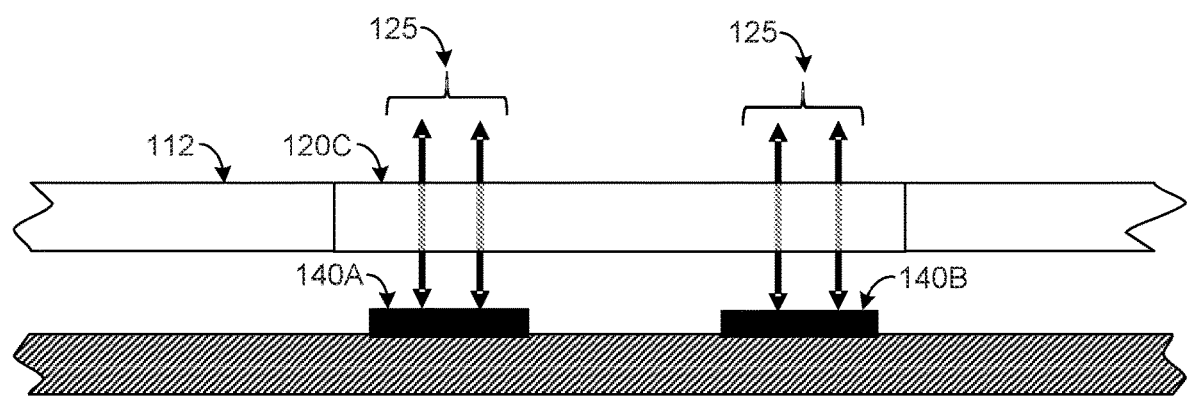
FIG. 2B depicts a side, cross-sectional view of a mobile device including a plurality of optical devices positioned by a single through-transmissive area of an emissive display according to a possible implementation of the disclosure.

FIG. 2A depicts a side, cross-sectional view of a mobile device having a display 112 with areas 120A, 120B through which electromagnetic radiation can be transmitted to an underlying optical device, for example, a fingerprint sensor, an ambient light sensor, or a proximity sensor. The mobile device can include multiple optical devices 140A, 140B, each positioned behind a different area 120A, 120B. FIG. 2B depicts a side, cross-sectional view of a mobile device having a display 112 with a single region 120C for use by the multiple optical devices 140A, 140B. The optical devices 140A, 140B may transmit and/or receive electromagnetic radiation 125 through the areas 120A, 120B, 120C.

Figure 3:
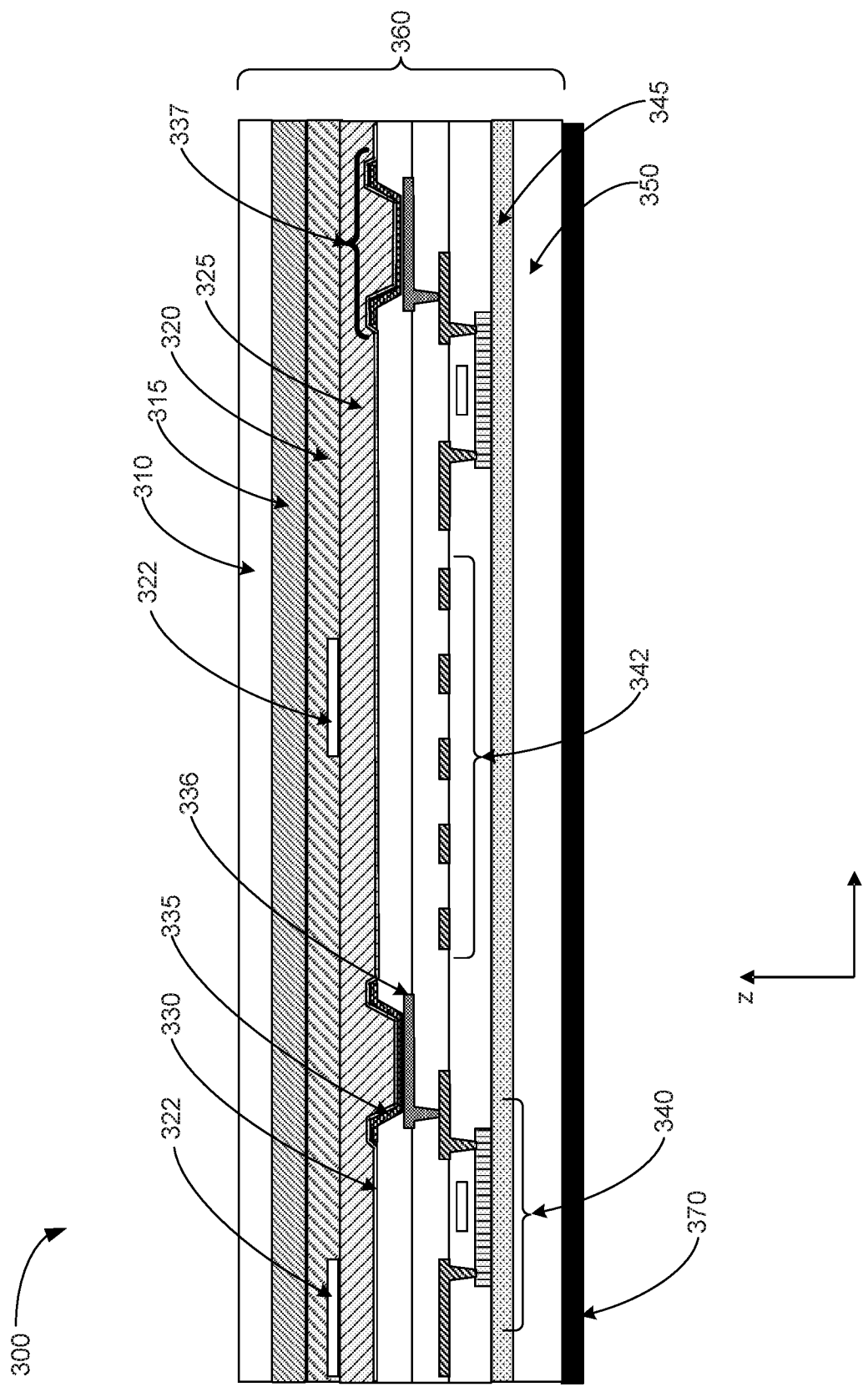
FIG. 3 depicts a possible side, cross-sectional view of an emissive display.

FIG. 3 illustrates a side, cross-sectional view of an emissive display (e.g., an AMOLED display) suitable for use with the mobile device of FIG. 1. While the principles of the disclosure may be applied to display technologies other than AMOLED displays, the implementation of an AMOLED display will be considered throughout the disclosure.

As shown in FIG. 3, the AMOLED display 300 includes a plurality of layers that make up a display panel 360. The layers include a cover glass layer 310 that can form the front surface of the mobile device 102. In a possible implementation, the display 300 can include a polarizer film layer 315. The display 300 can also include a touch sensor layer 320 that includes touch sensor electrodes 322. Pixels 337 for the display are formed from a cathode layer 330, an OLED emitter stack 335, and separate elements of an anode layer 336. Elements of the anode layer 336 may be reflective so that light emitted from the OLED emitter stack 335 is directed in a vertical (z) direction from the anode layer 336. An element of the anode layer 336 can be coupled to a thin film transistor (TFT) semiconductor structure 340 that includes a source, a gate, and a drain, which can be controlled by electrical signals transmitted over signal lines 342. The display 300 can further include a transparent barrier layer 345 that includes, for example, SiNx or SiONx and a transparent substrate layer 350 that includes, for example, polyimide (PI) and/or polyethylene terephthalate (PET). An opaque layer/film 370 for mechanical support, heat spreading, and electrical shielding can be located below the display panel 360 to protect the display from localized hot spots due to heat-generating elements in the mobile device, such as, for example, a CPU, a GPU, etc., as well as from electrical signals/electrical noise from electrical components in the device located below the display 300.

The layers of the display 300 may include transparent and non-transparent circuit elements. For example, the TFT structure 340, the pixels 337, the signal lines 342, and/or touch sensor electrodes 322 may all block light from propagating through the display 300. Light can be either reflected or absorbed by the non-transparent (i.e., opaque) circuit elements.

Figure 4:
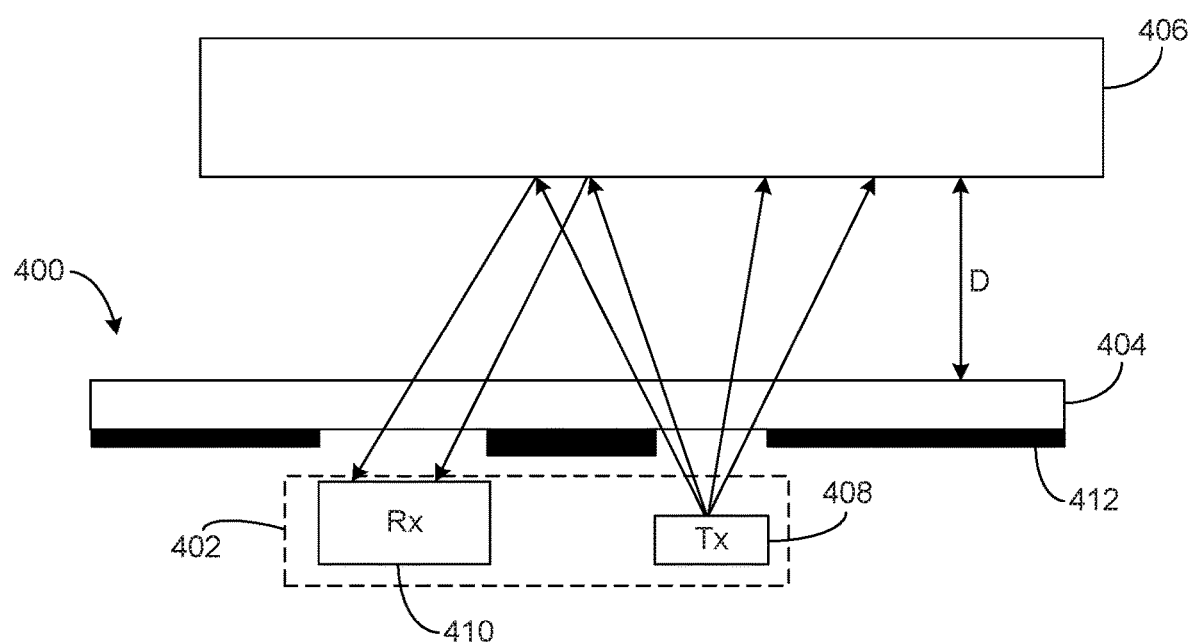
FIG. 4 is a schematic diagram of a display panel and a sensor located under the display panel interacting with an object that is a distance away from a front surface of the display panel.

FIG. 4 is a schematic diagram of mobile device 400 that includes a light sensor (e.g., a proximity sensor) 402 located under a display panel 404 interacting with an object 406 that is a distance, D, away from a front surface of the display panel 404. The light sensor 402 can include a transmitter 408 and a receiver 410 of electromagnetic radiation (e.g., infrared light). An opaque layer 412 for heat spreading and/or electrical shielding can be disposed between the display panel 404, and the proximity sensor 402 and/or an opaque layer 412 can be disposed between a layer that includes OLED emitters of the display and the proximity sensor 402. The opaque layer 412 can include one or more openings through which electromagnetic radiation can pass when transmitted to the object 406 and when received from the object. In some implementations, the electromagnetic radiation transmitted to the object 406 and received from the object can pass through different openings in the opaque layer 412 that are spatially separated from each other, and in some implementations, the electromagnetic radiation transmitted to the object 406 and received from the object can pass through the same opening, The proximity sensor 402 can operate by determining an amount of electromagnetic radiation (e.g., an intensity) that is emitted from the transmitter 408, reflected off the object 406, and then is received by the receiver 410. The amount of light received by the receiver 410 can be used as a signal for how close the front surface of the display panel 404 is to an object 406 under the assumption that the amount of light received by the intensity of received light increases monotonically with decreasing distance, D, between the display panel 404 and the object 406. The amount of light received at the receiver can be correlated with a distance between the object and the display panel, where the correlation is based on either an empirical calibration between received intensity and distance, or is based on a theoretical model of the propagation of light from the transmitter 408 to the object 406 and from the object 406 to the receiver 410, or a combination of the two.

Figure 5:
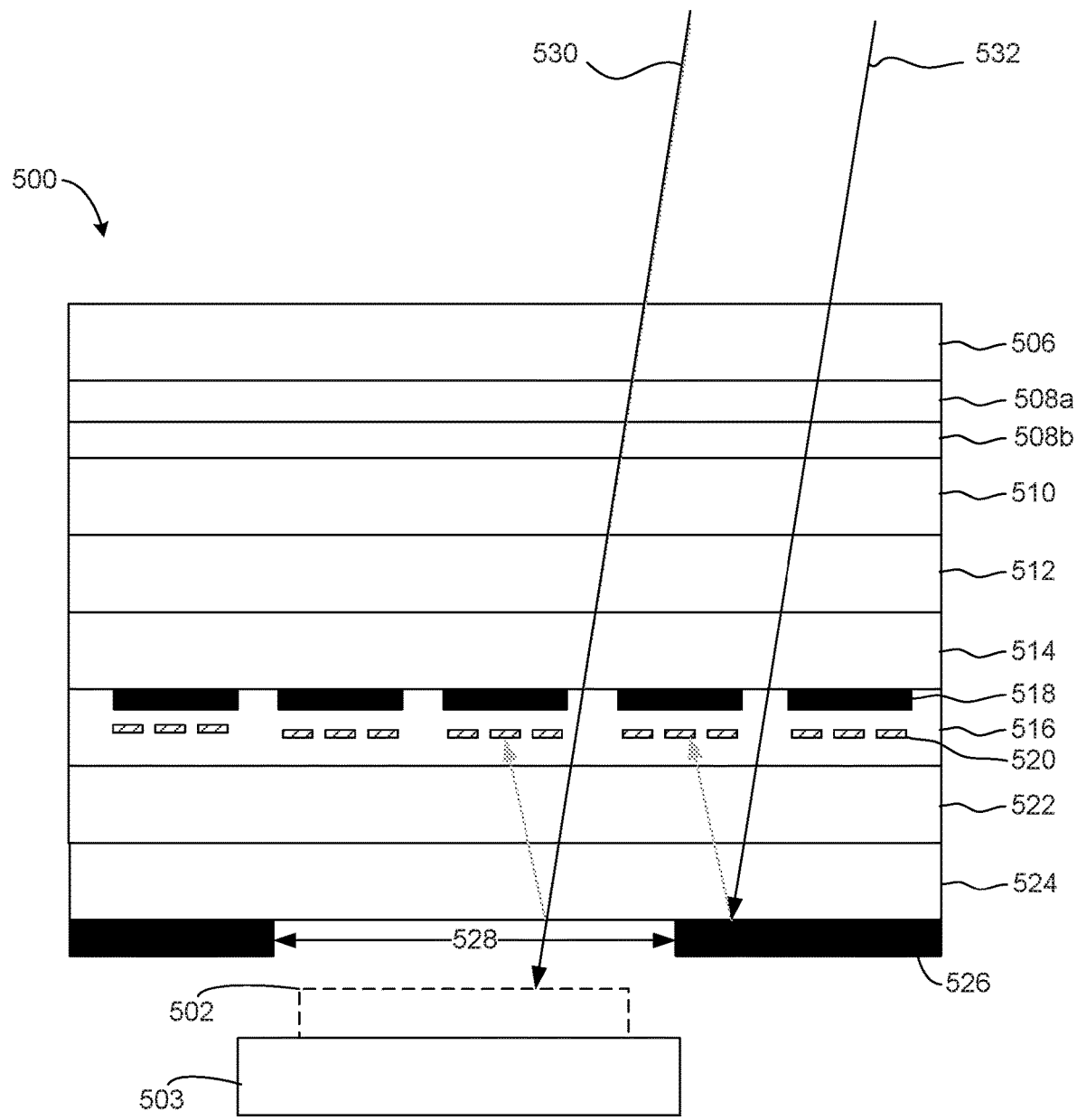
FIG. 5 is a schematic diagram an implementation of a display panel and a sensor located under the display panel illustrating light propagating through the display panel to the sensor.

FIG. 5 is a schematic diagram of an implementation of a display panel 500 and a sensor 502 located under the display panel 500 illustrating light propagating through the display panel to the sensor. The sensor 502 can be coupled to a sensor module 503 containing control electronics for operating the sensor.

The display panel can include multiple layers. For example, the display panel 500 can include a cover glass layer 506, a polarizer layer that can include a linear polarizer 508a and a quarter-waveplate 508b that can reduce the amount of light reflected off of an OLED layer in the panel that exits the front surface of the display, an encapsulation/touch sensor layer 510 containing touch sensor electrodes, a cathode layer, 512, an OLED layer 514, a pixel circuit layer 516 containing anodes 518 for supplying current to the OLEDs and semiconductor circuit elements 520 for controlling the current provided to the anodes, a PI layer 522, a PET layer 524, and an opaque back cover layer 526. An opening in the back cover layer 526 allows light from outside the display panel to pass through the panel and through the opening 528 to reach the sensor.

Two paths 530, 532 of light passing through the display panel 500 are shown in FIG. 5, with each path showing a possible reflection of light within the panel. In one path 532, light can traverse the transparent elements of the display panel and be reflected by a top surface of the back cover 526, such that the light is then directed back into the panel 500. However, the amount of light reflected from beam path 532 from the top surface of the back cover 526 can be relatively small due to the low reflectivity of the back cover 526 (e.g. 0.1% of the light in the incoming light). In another path 530, light can traverse the transparent elements of the display panel and be reflected by an the interface between a transparent layer (e.g., PET layer 524) and an air gap between the panel and a light sensor located below an opening 528 in the back cover 526 (i.e., as a result of a mismatch in the indices of refraction between air and the transparent layer), which also results in the reflection of light from the interface back into the panel 500. The reflection from the interface of the light path 530 can be appreciably higher (e.g. 4% of the incoming light) than the reflection of light along path 532 from the top surface of the back cover layer 526, and the difference results in higher exposure of the reflected light to the bottom surface of the semiconductor layer of the display pixel circuits than the rest of the display areas that are covered by the back cover 526.

In some cases, reflected light that strikes semiconductor circuit elements 520 can cause reduction in light emission from pixels, in turn resulting in unintended dark spots in the display. For example, although semiconductor circuit elements 520 are shielded from direct light that enters the front surface of the panel through the cover window layer 506 (e.g., by the anodes 518 or the OLEDs themselves), reflected light (e.g., high-intensity, short wavelength light) that strikes semiconductor circuit elements 520 can increase the TFT leakage current of a circuit that controls the emission of light from a pixel. In some cases, the increased leakage current can be due to the photoelectric effect caused by the reflected light on the circuit. The increased TFT leakage current for a circuit can cause a pixel controlled by the circuit to appear darker than intended. Because the semiconductor layer and the associated pixel circuits located over the opening 528 in the back cover 526 are struck by higher intensity reflected light, as compared with the rest of the display regions that are covered by the back cover 526, the display panel 500 may appear to have odd dark spots above the locations of under-the-display light sensors.

Figure 6:
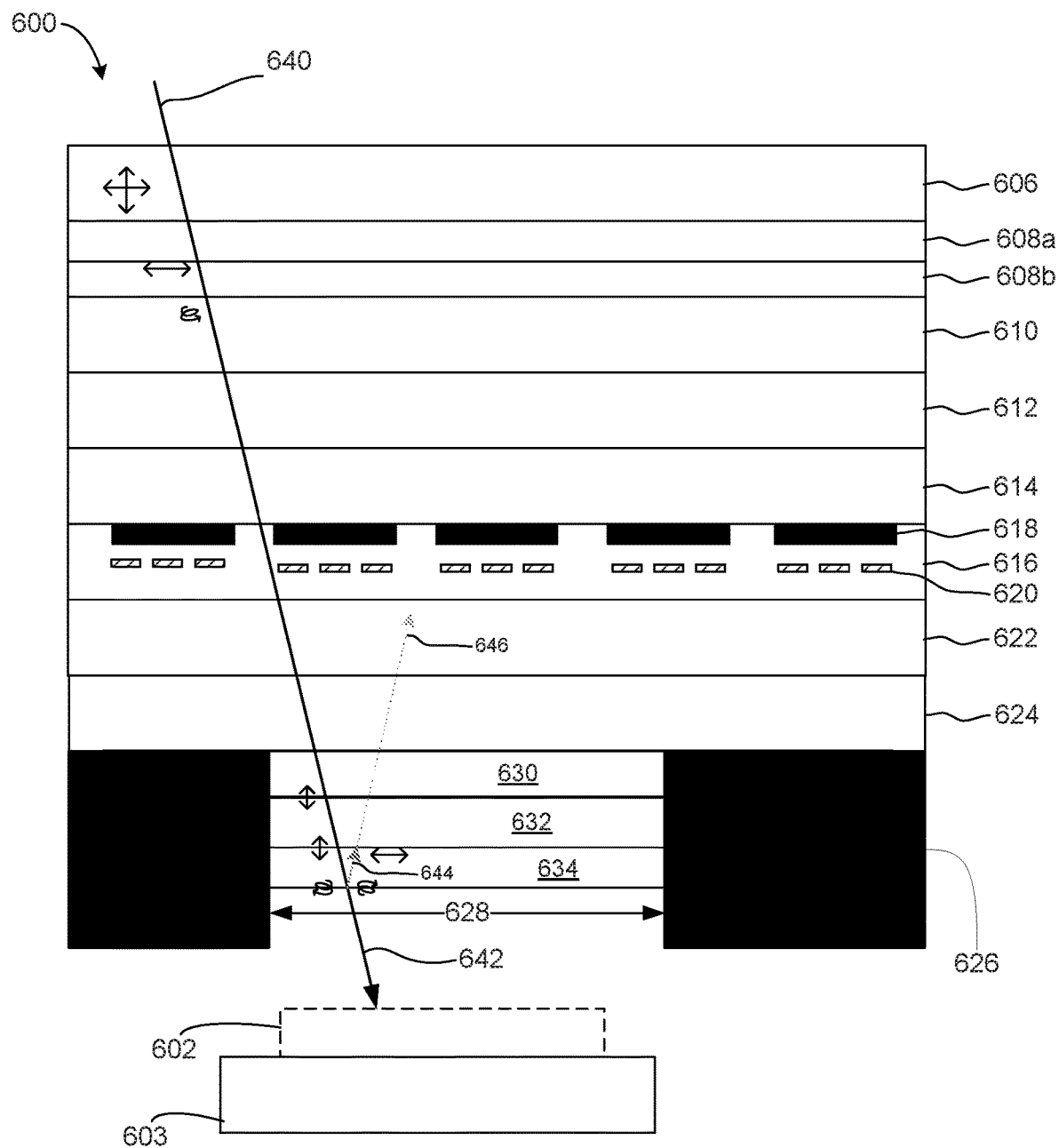
FIG. 6 is a schematic diagram another implementation of a display panel and a sensor located under the display panel illustrating light propagating through the display panel to the sensor.

FIG. 6 is a schematic diagram another implementation of a display panel 600 and a sensor 602 located under the display panel 600 illustrating light propagating through the display panel to the sensor. The sensor 602 can be coupled to a sensor module 603 containing control electronics for operating the sensor.

The display panel can include multiple layers. For example, the display panel 600 can include a cover glass layer 606, a polarizer layer that can include a linear polarizer 608a and a quarter wave plate 608b, an encapsulation/touch sensor layer 610 containing touch sensor electrodes, a cathode layer, 612, an OLED layer 614, a pixel circuit layer 616 containing anodes 618 for supplying current to the OLEDs and semiconductor circuit elements 620 for controlling the current provided to the anodes, a PI layer 622, a PET layer 624, and an opaque back cover layer 626. An opening 628 in the back cover layer 626 allows light from outside the display panel to pass through the panel and through the opening 628 to reach the sensor. A reflection attenuating layer on the back side of the display panel including a first film layer 630, a linear polarizer 632, and another quarter wave plate layer 634 can be included in the opening 628.

A path 640 of light passing through the display panel 600 is shown in FIG. 6. The structure of the additional layers 630, 632, 634 in display panel 600 as compared with the panel 500 can be used to reduce the amount of light reflected from the interface between the panel and the air gap between the panel and the light sensor 602. For example, when light enters the panel 600 through the cover window layer 606 the light can be randomly polarized. Then, after passing through the linear polarizer layer 608a, which is polarized in a first direction in a plane of the layer 608a, the light can be linearly polarized in the first direction. Then, after passing through the quarter wave plate 610, the light can be circularly polarized with a first chirality (e.g., right circularly polarized).

In some implementations, the first film layer 630 can include birefringent material, such that the layer 630 functions as a quarter wave plate for light transmitted through the layer. Thus, after passing through the first film layer 630 in the opening 628, the light can be linearly polarized in a second linear polarization direction, wherein the second linear polarization direction is orthogonal to the first linear polarization direction due to film 608a. This second linear polarization direction of the light can be transmitted with close to zero attenuation by the linear polarization layer 632, whose polarization axis is aligned with the second linear polarization direction of the light. Then, after passing through the second quarter wave plate layer 634 in the opening 628, the light can be circularly polarized with a second chirality (e.g., left circularly polarized), opposite to the first chirality. When the light interacts with the interface between the interface between the bottom transparent layer 634 of the panel and the air gap between the panel and the light sensor 602, a first portion 642 of the light is transmitted through the interface and a second portion 644 is reflected from the interface. The reflected portion of the light has the chirality of its polarization reversed, so that it is circularly polarized with the first chirality. Then, after again passing through the quarter wave plate 634 the reflected light is linearly polarized in the first direction. Because the first linear polarization direction is orthogonal to the polarization axis of the linear polarization layer 632, the reflected light is sharply attenuated by the layer 632, and very little light 646 is transmitted though the layer 632 in a direction from the back side of the panel toward the front side of the panel. Therefore, very little reflected light reaches the pixel circuit layer 616 containing semiconductor circuit elements 620 for controlling the current provided to the anodes 618 of the OLEDs. Therefore, the TFT leakage current of the pixels circuits does not increase, and the OLEDs emit their designed amounts of light, so that a dark spot in the display over the opening 628 for the sensor 602 can be avoided.

In some implementations, the transparent PET layer 624 of the display panel can introduce some polarization rotation to light passing through the layer 624. Therefore, the thickness, composition, and other material properties of the first film layer 630 can be selected, such that the combination of the PET layer 630 and the first film layer 630, which can include birefringent PET or non-PET material acts as a quarter wave plate to light passing through the combination of layers. In some implementations, one or more of layers 630, 632, 634 can be applied as coatings to the display panel 600.

Figure 7:
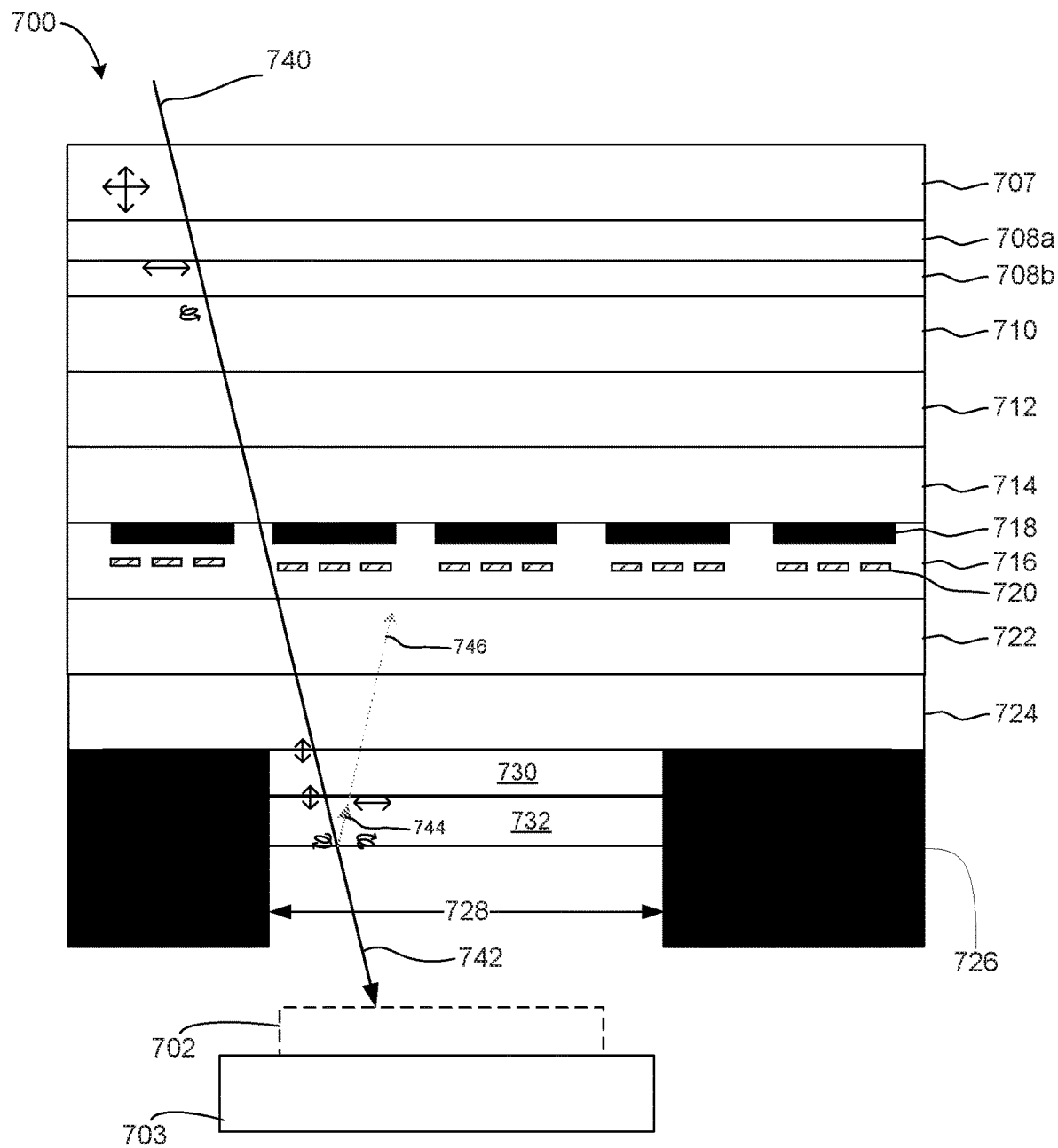
FIG. 7 is a schematic diagram another implementation of a display panel and a sensor located under the display panel illustrating light propagating through the display panel to the sensor, including polarization states of the light.

FIG. 7 is a schematic diagram another implementation of a display panel 700 and a sensor 702 located under the display panel 700 illustrating light propagating through the display panel to the sensor. The sensor 702 can be coupled to a sensor module 703 containing control electronics for operating the sensor.

The display panel can include multiple layers. For example, the display panel 700 can include a cover glass layer 706, a polarizer layer that can include a linear polarizer 708a and a quarter wave plate 708b, an encapsulation/touch sensor layer 710 containing touch sensor electrodes, a cathode layer, 712, an OLED layer 714, a pixel circuit layer 716 containing anodes 718 for supplying current to the OLEDs and semiconductor circuit elements 720 for controlling the current provided to the anodes, a PI layer 722, a first film layer (e.g., a PET film layer) 724, and an opaque back cover layer 726. An opening 728 in the back cover layer 726 allows light from outside the display panel to pass through the panel and through the opening 728 to reach the sensor. A reflection attenuating layer on the back side of the display panel including the first film layer 724, a linear polarizer 730, and a quarter wave plate layer 732, with at least some of the layers of the reflection attenuating layer being included in the opening 728. In some implementations, one or more of layers 724, 730, 732 can be applied as coatings to the display panel 700.

A path 740 of light passing through the display panel 700 is shown in FIG. 7. The reflection attenuating layer in display panel 700 can be used to reduce the amount of light reflected from the interface between the panel and the air gap between the panel and the light sensor 702. For example, when light enters the panel 700 through the cover window layer 706 the light can be randomly polarized. Then, after passing through the linear polarizer layer 708a, which is polarized in a first direction in a plane of the layer 708a, the light can be linearly polarized in the first direction. Then, after passing through the quarter wave plate 710, the light can be circularly polarized with a first chirality (e.g., right circularly polarized).

In some implementations, the first film layer 724, which in some implementations can include PET film, can include birefringent material, such that the layer 724 functions as a quarter wave plate for light transmitted through the layer. Thus, after passing through the first film layer 724, the light can be linearly polarized in a second linear polarization direction, wherein the second linear polarization direction is perpendicular to the first linear polarization direction. This second linear polarization direction of the light can be transmitted with close to zero attenuation by the linear polarization layer 730, whose polarization axis is aligned with the second linear polarization direction of the light. Then, after passing through the quarter wave plate layer 732 in the opening 728, the light can be circularly polarized with a second chirality (e.g., left circularly polarized), opposite to the first chirality. When the light interacts with the interface between the interface between the bottom transparent layer 732 of the panel and the air gap between the panel and the light sensor 702, a first portion 742 of the light is transmitted through the interface and a second portion 744 is reflected from the interface. The reflected portion of the light has the chirality of its polarization reversed, so that it is circularly polarized with the first chirality. Then, after again passing through the quarter wave plate 732 the reflected light is linearly polarized in the first direction. Because the first linear polarization direction is orthogonal to the polarization axis of the linear polarization layer 730, the reflected light is sharply attenuated by the layer 730, and very little light 746 is transmitted though the layer 730 in a direction from the back side of the panel toward the front side of the panel. Therefore, very little reflected light reaches the pixel circuit layer 716 containing semiconductor circuit elements 720 for controlling the current provided to the anodes 718 of the OLEDs. Therefore, the TFT leakage current of the pixels circuits does not increase, and the OLEDs emit their designed amounts of light, so that a dark spot in the display over the opening 728 for the sensor 702 can be avoided.

Figure 8:
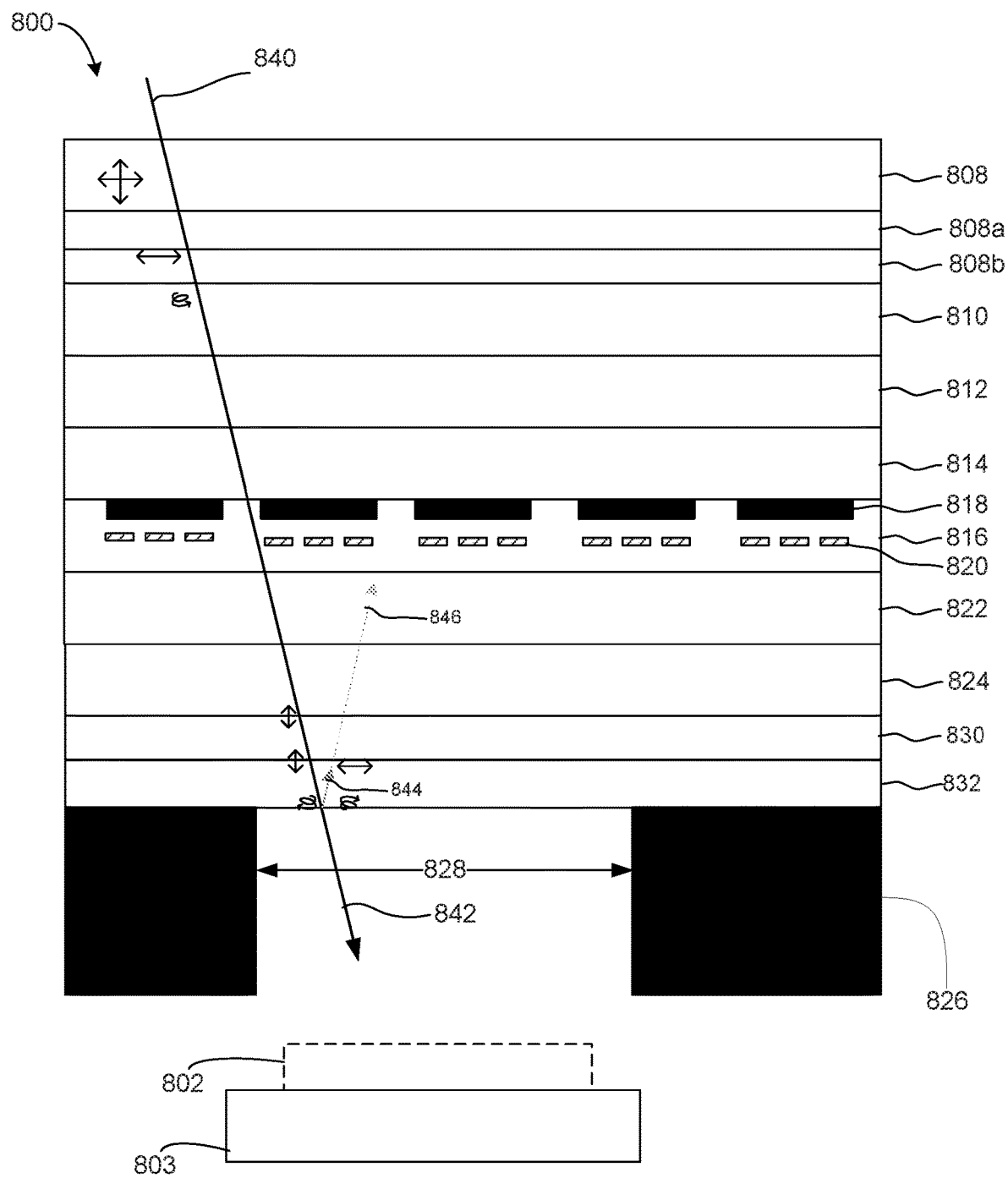
FIG. 8 is a schematic diagram another implementation of a display panel and a sensor located under the display panel illustrating light propagating through the display panel to the sensor, including polarization states of the light.

FIG. 8 is a schematic diagram another implementation of a display panel 800 and a sensor 802 located under the display panel 800 illustrating light propagating through the display panel to the sensor. The sensor 802 can be coupled to a sensor module 803 containing control electronics for operating the sensor. Like the display panels of FIGS. 6 and 7, the display panel 800 can include a reflection attenuating layer on the back side of the panel, but, unlike the display panels of FIGS. 6 and 7, the reflection attenuating layer in panel 800 can be located above the opaque back cover layer 826.

Thus, the display panel can include multiple layers, such as a cover glass layer 806, a polarizer layer that can include a linear polarizer 808a and a quarter wave plate 808b, an encapsulation/touch sensor layer 810 containing touch sensor electrodes, a cathode layer, 812, an OLED layer 814, a pixel circuit layer 816 containing anodes 818 for supplying current to the OLEDs and semiconductor circuit elements 820 for controlling the current provided to the anodes, a PI layer 822, a first film layer (e.g., a PET film layer) 824, a linear polarizer layer 830, a quarter wave plate layer 832, and an opaque back cover layer 826. An opening 828 in the back cover layer 826 allows light from outside the display panel to pass through the panel and through the opening 828 to reach the sensor. A reflection attenuating layer on the back side of the display panel 800 above the opaque back cover layer 826 can include the first film layer 824, the linear polarizer layer 830, and the quarter wave plate layer 832. In some implementations, one or more of layers 824, 830, 832 can be applied as coatings to the display panel 800.

In the implementation shown in FIG. 8, the first film layer 824, which in some implementations can include PET film, can include birefringent material, such that the layer 824 functions as a quarter wave plate for light transmitted through the layer. Thus, after passing through the first film layer 824, the light can be linearly polarized in a second linear polarization direction, wherein the second linear polarization direction is perpendicular to the first linear polarization direction. This second linear polarization direction of the light can be transmitted with close to zero attenuation by the linear polarization layer 830, whose polarization axis is aligned with the second linear polarization direction of the light. Then, after passing through the quarter wave plate layer 832, the light can be circularly polarized with a second chirality (e.g., left circularly polarized), opposite to the first chirality. When the light interacts with the interface between the interface between the bottom transparent layer 832 of the panel and the air gap between the panel and the light sensor 802, a first portion 842 of the light is transmitted through the interface and a second portion 844 is reflected from the interface. The reflected portion of the light has the chirality of its polarization reversed, so that it is circularly polarized with the first chirality. Then, after again passing through the quarter wave plate 832 the reflected light is linearly polarized in the first direction. Because the first linear polarization direction is orthogonal to the polarization axis of the linear polarization layer 830, the reflected light is sharply attenuated by the layer 830, and very little light 846 is transmitted though the layer 830 in a direction from the back side of the panel toward the front side of the panel. Therefore, very little reflected light reaches the pixel circuit layer 816 containing semiconductor circuit elements 820 for controlling the current provided to the anodes 818 of the OLEDs. Therefore, the TFT leakage current of the pixels circuits does not increase, and the OLEDs emit their designed amounts of light, so that a dark spot in the display over the opening 828 for the sensor 802 can be avoided.

In some cases, the implementation of FIG. 8, in which the reflection attenuating layer is located above the opening 828, rather than at least partially within the opening, can be easier to manufacture than an implementation with part of the reflection attenuating layer be located in the opening 828, but the cost of the materials (e.g., for polarization layers 824, 830, 832 that span the width of the display) may be higher.

Figure 9A:
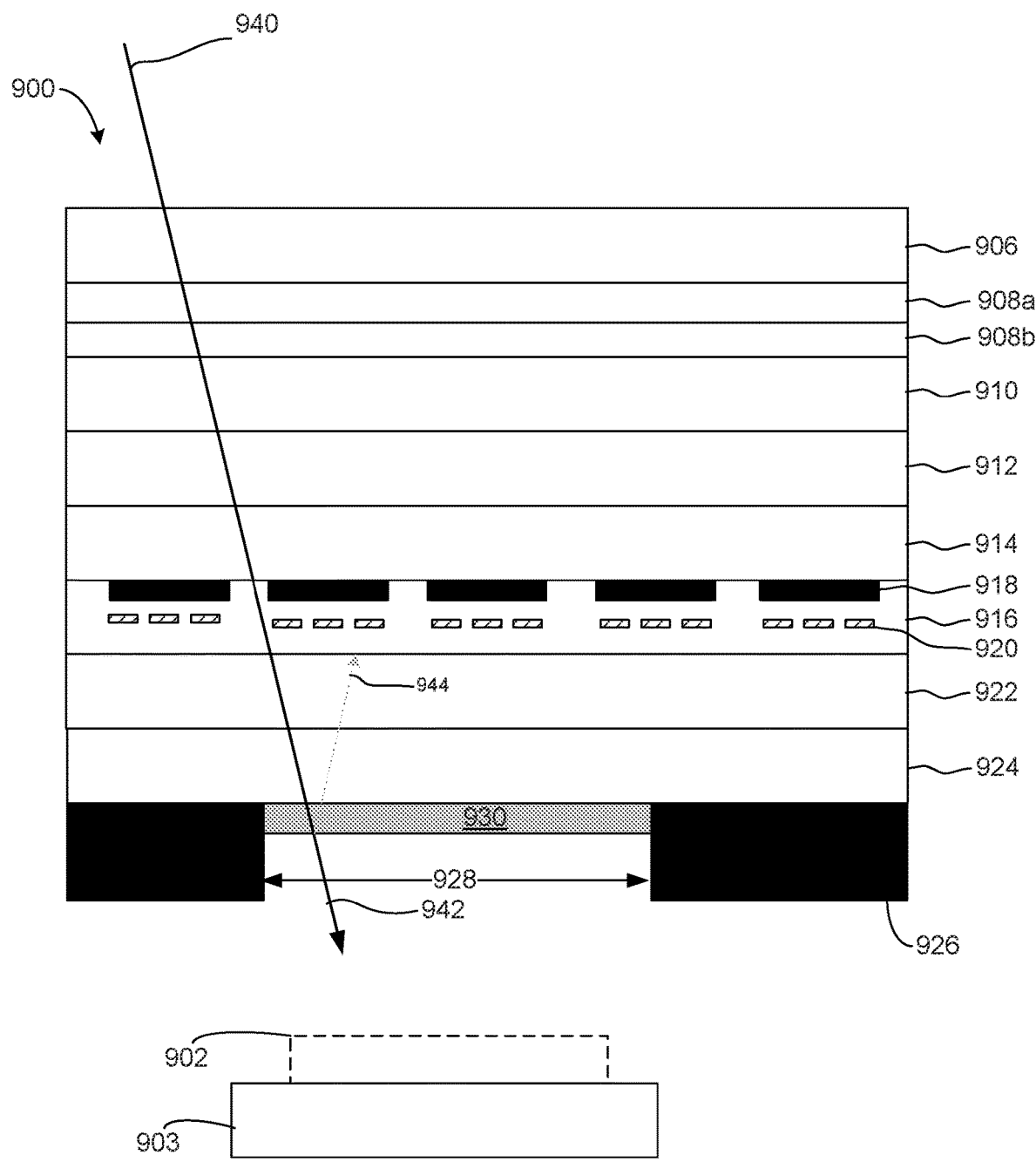
FIG. 9A is a schematic diagram another implementation of a display panel and a sensor located under the display panel illustrating light propagating through the display panel to the sensor.

FIG. 9A is a schematic diagram another implementation of a display panel 900 and a sensor 902 located under the display panel 900 illustrating light propagating through the display panel to the sensor. The sensor 902 can be coupled to a sensor module 903 containing control electronics for operating the sensor. The display panel 900 can include a reflection attenuating layer on the back side of the panel, where the reflection attenuating layer includes a partially-transmissive, partially-opaque layer or coating that attenuates the intensity of light that passes through the layer.

The display panel 900 can include multiple layers, such as a cover glass layer 906, a polarizer layer that can include a linear polarizer 908a and a quarter wave plate 908b, an encapsulation/touch sensor layer 910 containing touch sensor electrodes, a cathode layer, 912, an OLED layer 914, a pixel circuit layer 916 containing anodes 918 for supplying current to the OLEDs and semiconductor circuit elements 920 for controlling the current provided to the anodes, a PI layer 922, and a clear PET film layer 924. An opening 928 in the back cover layer 926 allows light from outside the display panel 900 to pass through the panel and through the opening 928 to reach the sensor 902. A reflection attenuating layer on the back side of the display panel 900 within the opening 928 in the opaque back cover layer 926 can include partially-transmissive, partially-opaque material layer 930 (e.g., a neutral density filter) that attenuates the light passing through the layer.

In the implementation shown in FIG. 9A, the transmissivity of the partially-transmissive, partially-opaque material layer 930 can be selected such that enough transmitted light 942 passes through the layer 930 for the sensor 902 to function as designed, but such that when light is transmitted through the layer twice (i.e., once in a direction toward the sensor 902 and once, after reflection from the interface with the air gap, in a direction away from the sensor 902), that the intensity of light 944 reflected from the air gap is attenuated enough that reflected light 944 does not interfere significantly with the operation of the semiconductor circuit elements 920 for controlling the current provided to the anodes 918 of the OLED emitters.

Figure 9B:
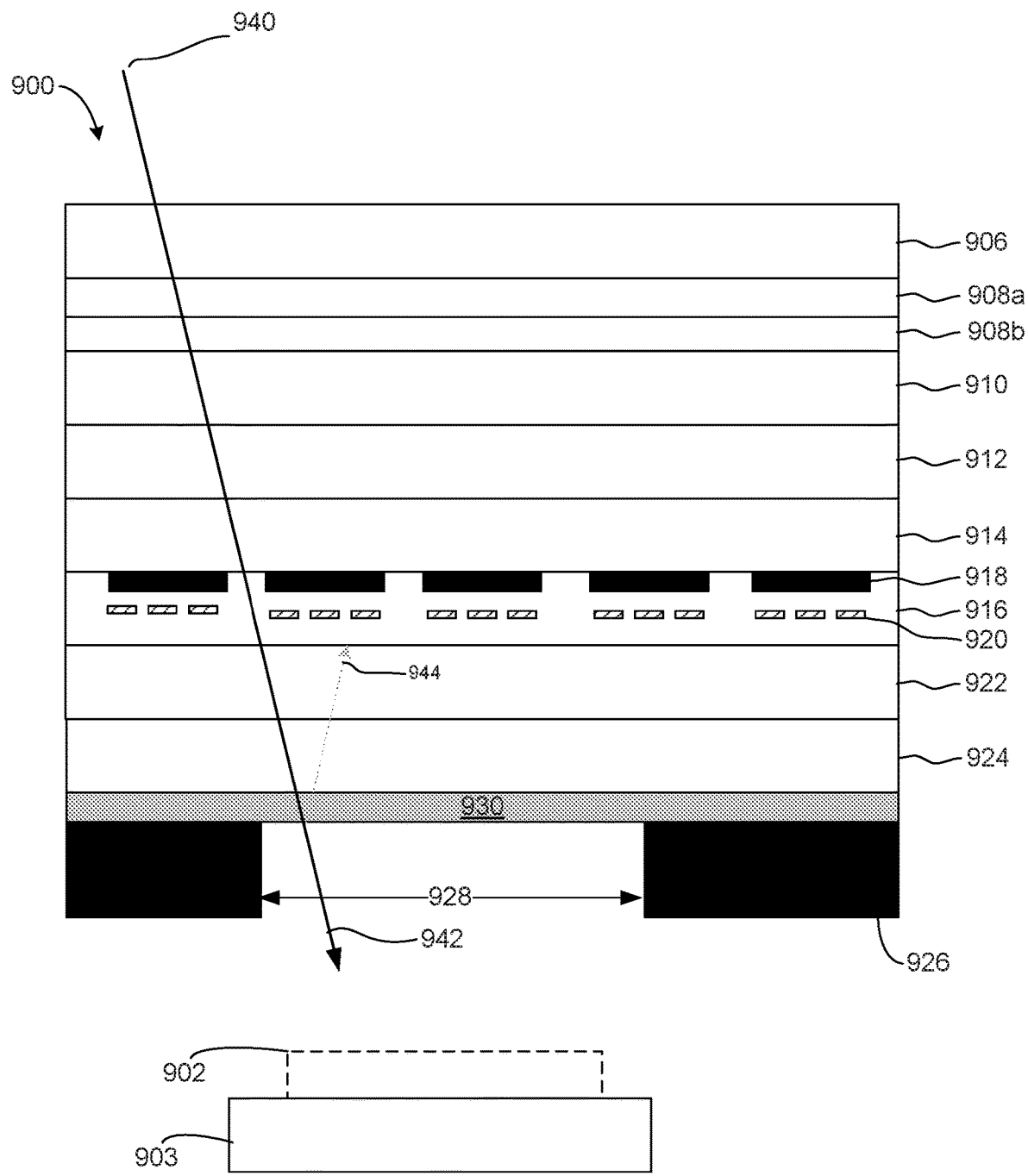
FIG. 9B is a schematic diagram another implementation of a display panel and a sensor located under the display panel illustrating light propagating through the display panel to the sensor.

FIG. 9B is a schematic diagram another implementation of a display panel and a sensor located under the display panel illustrating light propagating through the display panel to the sensor, wherein the implementation is similar to that of FIG. 9A, except that the partially-transmissive, partially-opaque material layer 930 is located above the opaque back cover layer 926. In some implementations, the layer 930 can be applied as a coating to the display panel 900.

In some implementations, one or more layers of the reflection attenuating layers of display panels 600, 700, or 800 can include a partially-transmissive, partially-opaque layer that attenuates the intensity of light that passes through the layer. For example, quarter wave plate layer or a linear polarizer layer of the reflection attenuating layers of display panels 600, 700, or 800 can include a partially-transmissive, partially-opaque layer.

The disclosed displays have been presented in the context of a mobile device, such as a tablet or a smart phone. The principles and techniques disclosed, however, may be applied more generally to any display in which it is desirable to position a sensor behind the display. For example, a virtual agent home terminal, a television, or an automatic teller machine (ATM) are a non-limiting set of alternative applications that could utilize a light sensor positioned behind an active area of a display. Further, the motivation for placing a light sensor behind a display is not limited to an expansion of the display to the edges of a device. For example, it may be desirable to place the light sensor behind a display for aesthetic or stealth reasons.

In the specification and/or figures, typical embodiments have been disclosed. The present disclosure is not limited to such exemplary embodiments. The use of the term "and/or" includes any and all combinations of one or more of the associated listed items. Unless otherwise noted, specific terms have been used in a generic and descriptive sense and not for purposes of limitation. As used in this specification, spatial relative terms (e.g., in front of, behind, above, below, and so forth) are intended to encompass different orientations of the device in use or operation in addition to the orientation depicted in the figures. For example, a "front surface" of a mobile computing device may be a surface facing a user, in which case the phrase "in front of" implies closer to the user. Additionally, a "top surface" of a display may be the surface facing a user, in which case the phrase "below" implies deeper into an interior of the mobile computing device.

While certain features of the described implementations have been illustrated as described herein, many modifications, substitutions, changes, and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components, and/or features of the different implementations described.

What is claimed is:

1. A mobile computing device comprising:
an emissive display panel configured to emit light from a front surface of the emissive display panel, the emissive display panel having a plurality of transparent layers and an opaque back cover layer; and
a light sensor located behind the opaque back cover layer, wherein the opaque back cover layer includes an opening through which light from outside the emissive display panel that is transmitted through the transparent layers of the emissive display panel is configured to pass to reach the light sensor, wherein an air gap separates the light sensor from the transparent layers of the emissive display panel, and wherein the light sensor is located behind an active area of the emissive display panel;
wherein the plurality of transparent layers includes a reflection attenuating layer on a back side of the emissive display panel configured to attenuate the reflection of light from an interface between a transparent layer of the emissive display panel and the air gap.

2. The mobile computing device of claim 1, wherein the emissive display panel includes an active matrix organic light emitting diode (AMOLED) display.

3. The mobile computing device of claim 1, wherein the opaque back cover layer includes a metal layer configured to spread heat through the metal layer.

4. The mobile computing device of claim 1, wherein the reflection attenuating layer includes a first quarter wave plate, a linear polarizer, and a second quarter wave plate, wherein the linear polarizer is located between the first and second quarter wave plates.

5. The mobile computing device of claim 4, wherein the first quarter wave plate, the linear polarizer, and the second quarter wave plate are located within the opening of the opaque back cover layer.

6. The mobile computing device of claim 4, wherein the first quarter wave plate, the linear polarizer, and the second quarter wave plate are located above the opaque back cover layer, between the back cover layer and the front surface of the emissive display panel.

7. The mobile computing device of claim 4, wherein the linear polarizer, and the second quarter wave plate are located within the opening of the opaque back cover layer, and wherein the first quarter wave plate is located above the opaque back cover layer, between the back cover layer and the front surface of the emissive display panel.

8. The mobile computing device of claim 4, wherein the first quarter wave plate includes a PET film layer.

9. The mobile computing device of claim 4, wherein the first quarter wave plate includes a combination of a PET film layer and a birefringent non-PET film layer.

10. The mobile computing device of claim 4, wherein one or more of the first quarter wave plate, the linear polarizer, or the second quarter wave plate includes a partially-transmissive, partially-opaque layer.

11. The mobile computing device of claim 1 wherein the reflection attenuating layer includes a partially-transmissive, partially-opaque layer that attenuates an intensity of light that passes through the layer.

12. The mobile computing device of claim 11, wherein the partially-transmissive, partially-opaque layer is located within the opening of the opaque back cover layer.

13. The mobile computing device of claim 11, wherein the partially-transmissive, partially-opaque layer is located above the opaque back cover layer, between the back cover layer and the front surface of the emissive display panel.

14. The mobile computing device of claim 1, wherein:
the active area of the emissive display panel that is located in front of the light sensor includes organic light emitting diode (OLED) emitters and semiconductor circuit elements configured to control a luminance of light emitted from the OLED emitters; and
the emissive display panel includes a polarization layer that receives randomly-polarized light from outside the emissive display panel and circularly polarizes the light as a result of the light propagating through the polarization layer, the polarization layer being located between the front surface of the emissive display panel and the OLED emitters that are located in front of the light sensor.

15. The mobile computing device of claim 1, wherein:
the active area of the emissive display panel that is located in front of the light sensor includes organic light emitting diode (OLED) emitters and semiconductor circuit elements configured to control a luminance of light emitted from the OLED emitters; and
the semiconductor circuit elements that are located in front of the light sensor are shielded from direct light received from outside the emissive display panel by at least some opaque structures in the emissive display panel.

16. An emissive display panel configured to emit light from a front surface of the emissive display panel, the emissive display panel comprising:
a plurality of transparent layers;
an opaque back cover layer, wherein the opaque back cover layer includes an opening through which light from outside the emissive display panel that is transmitted through the transparent layers of the emissive display panel is configured to pass to reach a light sensor located behind the opaque back cover layer and separated by an air gap from the transparent layers of the emissive display panel, wherein the transparent layers of the emissive display panel through which the light from outside the emissive display panel is configured to pass to reach the light sensor comprise an active area of the emissive display panel; and
a reflection attenuating layer on a back side of the emissive display panel configured to attenuate the reflection of light from an interface between a transparent layer of the emissive display panel and the air gap.

17. The emissive display panel of claim 16, wherein the opaque back cover layer includes a metal layer configured to spread heat through the metal layer.

18. The emissive display panel of claim 16, wherein the reflection attenuating layer includes a first quarter wave plate, a linear polarizer, and a second quarter wave plate, wherein the linear polarizer is located between the first and second quarter wave plates.

19. The emissive display panel of claim 18, wherein the first quarter wave plate, the linear polarizer, and the second quarter wave plate are located within the opening of the opaque back cover layer.

20. The emissive display panel of claim 16, wherein:
the active area of the emissive display panel that is located in front of the light sensor includes organic light emitting diode (OLED) emitters and semiconductor circuit elements configured to control a luminance of light emitted from the OLED emitters; and
the emissive display panel further comprises a polarization layer that receives randomly-polarized light from outside the emissive display panel and circularly polarizes the light as a result of the light propagating through the polarization layer, the polarization layer being located between the front surface of the emissive display panel and the OLED emitters that are located in front of the light sensor.

21. The emissive display panel of claim 16, wherein:
the active area of the emissive display panel that is located in front of the light sensor includes organic light emitting diode (OLED) emitters and semiconductor circuit elements configured to control a luminance of light emitted from the OLED emitters; and
the semiconductor circuit elements that are located in front of the light sensor are shielded from direct light received from outside the emissive display panel by at least some opaque structures in the emissive display panel.

* * * * *